United States Patent [19]

Uchida et al.

[11] Patent Number: 5,179,863
[45] Date of Patent: Jan. 19, 1993

[54] METHOD AND APPARATUS FOR SETTING THE GAP DISTANCE BETWEEN A MASK AND A WAFER AT A PREDETERMINED DISTANCE

[75] Inventors: Norio Uchida, Yokohama; Nobutaka Kikuiri, Tokyo, both of Japan

[73] Assignee: Kabushiki Kaisha Toshiba, Kawasaki, Japan

[21] Appl. No.: 664,850

[22] Filed: Mar. 5, 1991

[30] Foreign Application Priority Data

Mar. 5, 1990 [JP] Japan .................................. 2-51681

[51] Int. Cl.⁵ .............................................. B65G 43/00
[52] U.S. Cl. .................................. 73/865.8; 356/363; 33/645
[58] Field of Search ...................... 73/865.8, 865.9; 33/645, 615, 613; 356/363

[56] References Cited

U.S. PATENT DOCUMENTS

| | | | |
|---|---|---|---|
| 3,218,915 | 6/1962 | Ramsay | 356/363 |
| 4,265,542 | 5/1981 | Snow | 356/363 |
| 4,332,473 | 6/1982 | Ono | 356/363 |
| 4,563,820 | 1/1986 | Isohata | 33/645 |
| 4,746,217 | 5/1988 | Holly | 356/363 |
| 4,750,141 | 6/1988 | Judell et al. | 73/865.8 |
| 4,815,854 | 3/1989 | Tanaka et al. | 356/363 |
| 4,838,693 | 6/1989 | Uchida et al. | 356/356 |
| 4,914,964 | 4/1990 | Speiser | 73/865.9 |
| 5,017,011 | 5/1991 | Lisson et al. | 356/363 |

OTHER PUBLICATIONS

Nikkei Microdevices; Apr. 1986; pp. 115-127.

*Primary Examiner*—Hezron E. Williams
*Assistant Examiner*—Howard Wisnia
*Attorney, Agent, or Firm*—Oblon, Spivak, McClelland, Maier & Neustadt

[57] ABSTRACT

An apparatus for setting the gap distance between a mask and a wafer, facing with each other to a predetermined distance, is arranged as follows. A wafer stage is movable along a reference plane defined as a plane parallel to the transferring direction of the wafer and supports the wafer. The wafer stage has a $\theta y$ table for tilting the wafer and a first displacement sensor. A mask stage supports the mask and has a $\theta y$ table for tilting the mask and two second displacement sensors. The first sensor scans the mask in response to the movement of the wafer stage, whereby an error in the parallelism of the wafer with respect to the reference plane is measured. The mask is kept parallel to the reference plane by tilting the mask so as to eliminate the error in the parallelism. Distances from the second sensors to two points on the wafer are measured by the second sensors. The gap distances between the mask and two points on the wafer are obtained by substracting the distance between the mask and second sensors from the measured distances, individually. The mask and the wafer are kept parallel to each other by tilting the wafer so as to eliminate the error in the parallelism thus obtained, and the gap distance between the mask and wafer is adjusted to be set at the predetermined distance.

5 Claims, 6 Drawing Sheets

METHOD AND APPARATUS FOR SETTING THE GAP DISTANCE BETWEEN A MASK AND A WAFER AT A PREDETERMINED DISTANCE

BACKGROUND OF THE INVENTION

1. Field of the Invention

The present invention relates to a method and an apparatus for setting the gap distance between two objects at a predetermined distance. More specifically, the invention relates to a method and an apparatus for setting the gap distance between a mask and a wafer at a predetermined distance in parallel relation when the image of a circuit pattern of the mask is transferred to the wafer in a semiconductor manufacturing process.

2. Description of the Related Art

In the process of manufacturing a semiconductor device, such as a VLSI, a circuit pattern of the device, which is previously formed on a mask, is transferred to a wafer. In an X-ray exposure apparatus, for example, X-rays are applied to the wafer through the mask having the circuit pattern, whereby an image of the pattern is transferred to the wafer. Before the transfer of the circuit pattern, the mask and the wafer, which are opposed to each other, should be arranged so that the gap distance between them is set at a predetermined distance, ranging from 20 to 50 $\mu$m, for example.

Conventionally known is a method for setting the gap distance between the mask and the wafer on the basis of the focusing effect of lenses.

In this method, three CCD cameras, whose optical axes extend parallel to one another, are arranged at the back of a mask chuck. Each camera is movable along its own optical axis. A mark is formed on each of the film of the mask and the wafer so as to be situated on the optical axis of each camera. One of the CCD cameras is moved from a position where it is focused on its corresponding mark of the mask or the wafer to a position where it is focused on the mark of the other. Since the distance between the two focusing positions of each CCD camera is equal to a gap distance between the mask and the wafer with respect to one point, the latter can be obtained by measuring the former. Likewise, gap distances between the mask and the wafer can be obtained with respect to two other points by means of the two other CCD cameras. By adjusting these gap distances, the mask and the wafer can be set parallel to each other so that the gap distance between them is fixed at a predetermined distance.

According to the method described above, however, it is relatively difficult to discriminate the focusing positions, so that the gap distance between the mask and the wafer cannot be accurately detected. Therefore, setting the gap distance cannot be accomplished with accuracy. Since a complicated optical system is need to attain the focusing effect of the lenses, the construction of an apparatus for setting the gap distance is not very simple. Since the measurable range with respect to the direction of the gap distance is relatively narrow, furthermore, the mechanical mounting accuracy of the mask and the wafer and their thicknesses should be accurately controlled.

Also known is a conventional method in which diffraction gratings are used to set the gap distance. According to this method, however, ripples are superposed on detection signals, so that the gap distance cannot be accurately detected. Since a complicated optical system is required for the measurement of the gap distance, moreover, the apparatus for setting the gap distance has a complicated construction.

If the accuracy of the gap distance setting means used is relatively low as aforesaid, the mask and the wafer, which face each other across the very fine gap distance, may possibly run against each other. It is not advisable, therefore, to use such means. When the gap distance is detected at the respective central portions of the mask and the wafer, in particular, the possibility of their running against each other is very high, since a substantial error is caused at their respective peripheral portions, although the distance at the central portions is subject to only a minor error.

SUMMARY OF THE INVENTION

An object of the present invention is to provide a method for accurately setting the gap distance between a mask and a wafer in parallel relation.

Another object of the invention is to provide a method and an apparatus for accurately setting the gap distance between a mask and a wafer in parallel rotation with use of a simple construction which doesn't require any complicated optical system.

In a method for setting the gap distance between two objects at a predetermined distance according to the present invention, an error in the parallelism of the sample surface of a second object with respect to an imaginary reference plane defined as a plane parallel to the traveling direction of a first object is first measured. The sample surface of the second object is kept parallel to the imaginary reference plane by tilting the second object so as to eliminate the error in the parallelism. Then, an error in the parallelism of the sample surface of the first object with respect to the sample surface of the second object and the gap distance between the respective sample surfaces of the first and second objects are measured. The respective sample surfaces of the first and second objects are kept parallel to each other by tilting the first object so as to eliminate the error in the parallelism. Then, the gap distance between the respective sample surfaces of the first and second objects are adjusted to the predetermined distance.

An advantage of this method lies in that the gap distance can be relatively accurately set at the predetermined distance, since the setting is executed with reference to the reference plane.

In an alternative method for setting the gap distance between two objects at a predetermined distance according to the invention, an apparatus is used which comprises a first moving stage movable along an imaginary reference plane defined as a plane parallel to the transferring direction of a first object and supporting the first object, the first moving stage including means for tilting the first object and a first displacement sensor, and a second moving stage supporting a second object and including means for tilting the second object and at least two second displacement sensors. According to this method or apparatus, the first displacement sensor of the first moving stage moves along the imaginary reference plane to scan the sample surface of the second object, thereby measuring an error in the parallelism of the sample surface of the second object with respect to the reference plane. The sample surface of the second object is kept parallel to the reference plane by tilting the second object so as to eliminate the error in the parallelism. Distances from the second displacement sensors to at least two points on the sample surface of the first object are measured by means of the second displacement sensors. The gap distances between the sample surface of the second object and the at least two points on the sample surface of the first object are obtained by subtracting the distances between the sample surface of the second object and the second displacement sensors from the measured distances, individually. As a result, an error in the parallelism of the sample surface of the first object with respect to the sample surface of the second object and the gap distance between the respective sample surfaces of the first and second objects are obtained. The respective sample surfaces of the first and second objects are kept parallel to each other by tilting the first object so as to eliminate the error in the parallelism thus obtained, and the gap distance between the respective sample surfaces of the first and second objects is adjusted to be set at the predetermined distance.

In order to facilitate the measurement of the gap distance, the second moving stage may include at least two targets arranged corresponding individually to the second displacement sensors. In this case, the first displacement sensor scans the targets and the sample surface of the second object in response to the movement of the first moving stage along the reference plane. As a result, distances ($\alpha_A$, $\alpha_B$) between the first displacement sensor and the targets and distances ($\beta_A$, $\beta_B$) between the sample surface of the second object and the first displacement sensor are measured. The differences between the distances ($\alpha_A$, $\alpha_B$) between the first displacement sensor and the targets and the distances ($\beta_A$, $\beta_B$) between the sample surface of the second object and the first displacement sensor are calculated, so that distances ($\gamma_A$, $\gamma_B$) between the sample surface of the second object and the targets are obtained. The sums of or the differences between the distances ($\gamma_A$, $\gamma_B$) between the sample surface of the second object and the targets and previously obtained distances ($\delta_A$, $\delta_B$) between the targets and the second displacement sensors are obtained, so that distances ($\epsilon_A$, $\epsilon_B$) between the sample surface of the second object and the second displacement sensors are obtained.

Advantages of this method or apparatus lie in that the use of the displacement sensors as the means for detecting the distances obviates the necessity of a complicated optical system, which is conventionally required, and an accurate adjustment of the focus. Despite the use of a simple construction, therefore, the gap distance between the mask and the wafer can be very accurately set at the predetermined distance in parallel relation, even if the mechanical mounting accuracy of the mask and the wafer is poor, and/or if the mask and the wafer are subject to variations in thickness.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
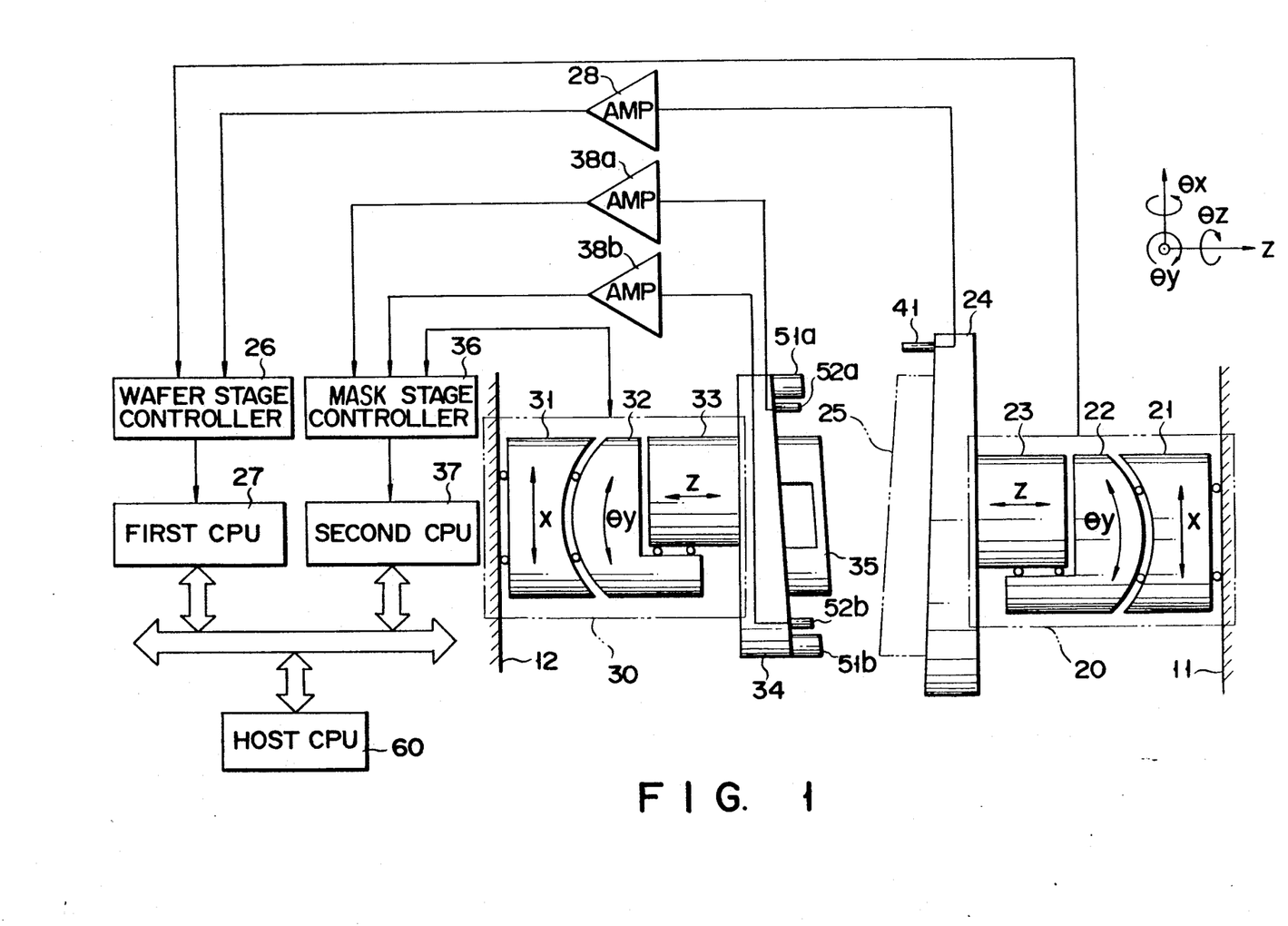
FIG. 1 is a view diagrammatically showing an apparatus for setting the gap distance between a mask and a wafer at a predetermined distance according to a first embodiment of the present invention.

FIG. 1 shows an apparatus for setting the gap distance between a mask and a wafer at a predetermined distance. First, X, Y and Z axes and rotating directions $\theta_X$, $\theta_Y$ and $\theta_Z$ are defined, as shown in FIG. 1 on the right-hand side thereof. According to the present invention, the gap distance can be set in a three-dimensional space. In a first embodiment of the invention, however, the gap distance is supposed to be set in a two-dimensional space for ease of illustration. An imaginary reference plane is supposed to be identical with a wall surface 11, which is formed parallel to an X-Y plane.

A wafer stage 20 includes an X table 21 movable along the wall surface or reference plane 11, a $\theta_Y$ table 22 mounted on the X table 21 so as to be rockable or tiltable in the $\theta_Y$ direction, and a Z table 23 mounted on the $\theta_Y$ table 22 so as to be movable in the direction of the Z axis. The Z table 23 is provided with a wafer chuck 24 for loading a wafer 25 by vacuum suction or electrostatic action.

A mask stage 30 includes an X table 31 movable along a reference plane 12, which is defined as a wall surface parallel to the reference plane 11, a $\theta_Y$ table 32 tiltable in the $\theta_Y$, and a Z table 33 movable in the Z-axis direction. The Z table 33 is provided with a mask chuck 34 for loading a mask 35.

The wafer stage 20 and the mask stage 30 are feedback-controlled by means of a wafer stage controller 26 and a mask stage controller 36, respectively. These controllers 26 and 36 are given control commands from first and second CPUs 27 and 37, respectively, and the control of the whole system is executed by means of a host CPU 60.

In the first embodiment, moreover, a first displacement sensor (e.g., electrostatic capacity sensor) 41 is provided on the peripheral portion of the wafer chuck 24. Two targets 51a and 51b and two second displacement sensors 52a and 52b are provided on the peripheral portion of the mask chuck 34. A detection value from the first displacement sensor 41 is supplied to the wafer stage controller 26 after being amplified by means of an amplifier 28, while detection values from the second displacement sensors 52a and 52b are supplied to the mask stage controller 36 after being amplified by means of amplifiers 38a and 38b, , respectively.

Figure 2:
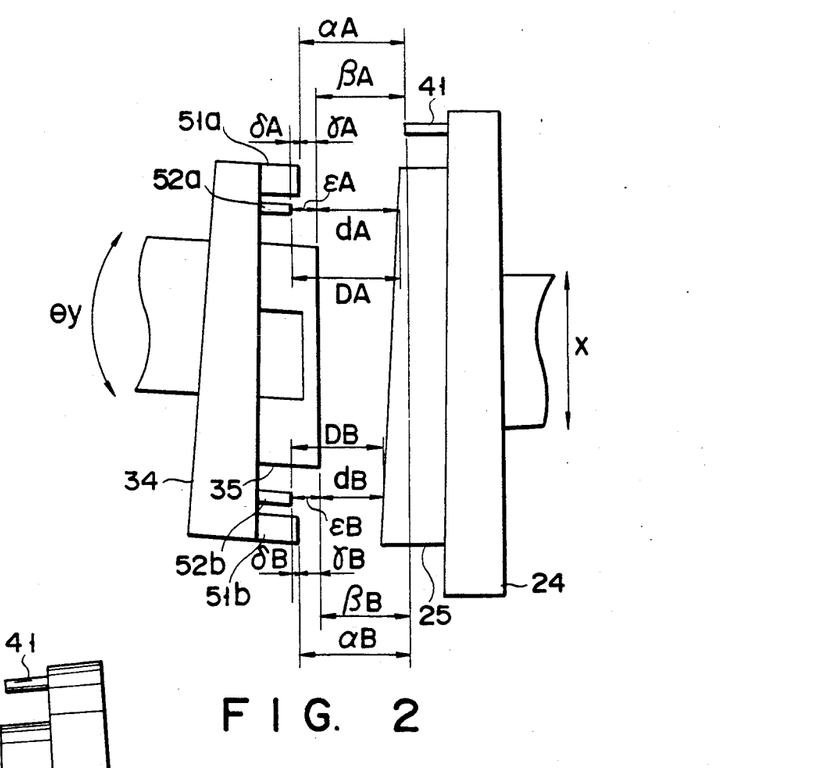
FIGS. 2 and 3 are views diagrammatically showing the principle of a method for setting the gap distance between the mask and the wafer at the predetermined distance by means of the apparatus shown in FIG. 1.
Figure 3:
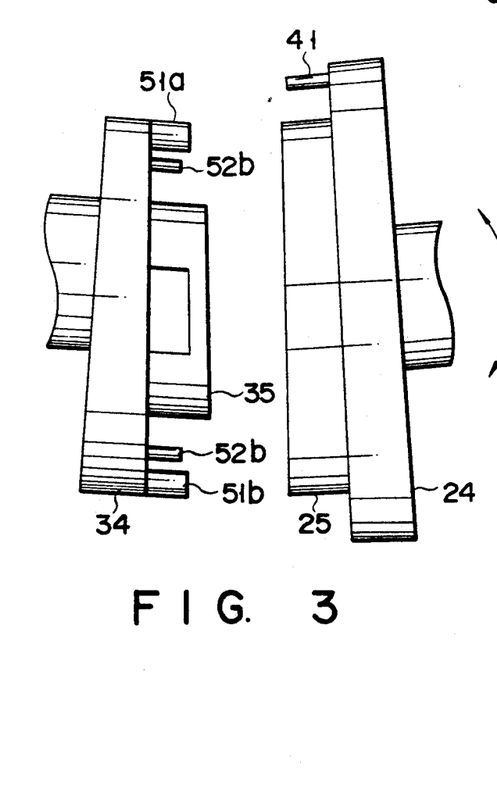

Referring now to FIGS. 1 to 3, a method for setting the gap distance at a predetermined distance according to the first embodiment will be described.

As shown in FIG. 1, the mask chuck 34 is loaded with the mask 34. At this time, the wafer chuck 24 is not loaded with the wafer 25.

Figure 4:
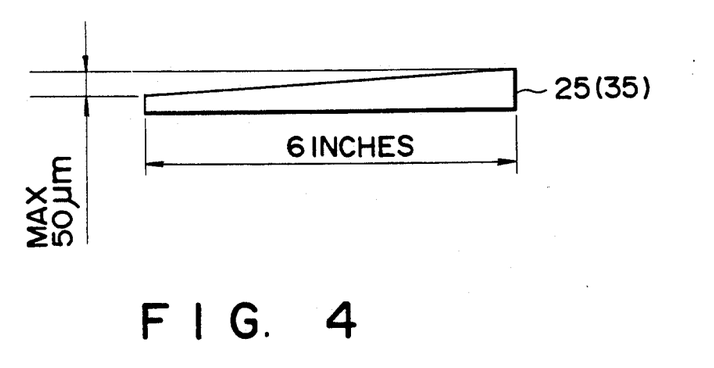
FIG. 4 is a view diagrammatically showing the gradient of the mask or the wafer.

When the mask is loaded, the mask and the wafer generally have gradients in the thickness direction, although their flatness is satisfactory, as shown in FIG. 4, due to their manufacturing reasons. Thus, the top surface of the mask combines errors $\Delta Z$ and $\Delta \theta$, attributable to the assembling of the mask stage 30 and the mask chuck 34, with variation in thickness of the mask itself, that is, errors $\Delta Z$ and $\Delta \theta_Y$ attributable to the gradient. Accordingly, the parallelism of the top surface of the mask with respect to the reference plane 11 is unknown.

In a first process, therefore, the error $\Delta \theta_Y$ in the parallelism of the top surface of the mask or a sample surface, with respect to the reference plane 11, is measured. More specifically, in the first embodiment, the wafer stage controller 26 moves the wafer-side X table 21 on the reference plane 11 in the direction of the X axis. Thereupon, the first displacement sensor 41 scans the top surface of the mask. By doing this, the sensor 41 can measure the error $\Delta \theta_Y$ in the parallelism of the top surface of the mask with respect to the reference plane 11. The measured value is supplied to the wafer stage controller 26 after being amplified by means of the amplifier 28.

At this time, the error $\Delta Z$, as well as the error $\Delta \theta_Y$, can be detected. If the first displacement sensor 41 is mounted on the wafer chuck 24, however, the Z position of the sensor 41 directly involves the assembling error of the wafer stage. Accordingly, the accuracy of the detected error $\Delta Z$ is unknown. Thus, the error $\Delta Z$ is detected in a subsequent stage without being detected in this stage.

Then, in a second process, the mask is tilted by means of the $\theta_Y$ table 32 so that the error $\Delta \theta_Y$ is removed by means of the mask stage controller 36. By doing this, the top surface of the mask can be kept parallel to the reference plane 11, as shown in FIG. 2.

In a third process, moreover, unknown distances $\epsilon_A$ and $\epsilon_B$ between the top surface of the mask and the second sensors 52a and 52b are detected.

More specifically, the wafer stage controller 26 moves the wafer-side X table 21 again on the reference plane 11 in the X-axis direction, so that the first displacement sensor 41 scans the targets 51a and 51b and the top surface of the mask. By doing this, the sensor 41 can measure distances $\alpha_A$ and $\alpha_B$ between itself and the targets 51a and 51b, respectively, and also, distances $\beta_A$ and $\beta_B$ between itself and the top surface of the mask. Since the top surface of the mask is corrected with respect to the $\theta_Y$ direction, however, distances $\beta_A$ and $\beta_B$ are equal. The measured values of these distances $\alpha_A$, $\alpha_B$, $\beta_A$ and $\beta_B$ from the first sensor 41 are supplied through the wafer stage controller 26 to the first CPU 27 after being amplified by mean of the amplifier 28. By calculating the differences between the distances $\alpha_A$ and $\alpha_B$ and the distances $\beta_A$ and $\beta_B$, the CPU 27 can obtain distances $\gamma_A$ and $\gamma_B$ between the top surface of the mask and the targets 51a and 51b, respectively. Meanwhile, distances $\delta_A$ and $\delta_B$ between the targets 51a and 51b and the second sensors 52a and 52b, respectively, are previously obtained and supplied to the first CPU 27. By calculating the sum of the distances $\gamma_A$ and $\gamma_B$ and the distances $\delta_A$ and $\delta_B$, therefore, the CPU 27 can obtain the distances $\epsilon_A$ and $\epsilon_B$ between the top surface of the mask and the second sensors 52a and 52b, respectively.

After obtaining the distances $\gamma_A$ and $\gamma_B$, the first CPU 27 causes the wafer stage controller 26 to load the wafer chuck 24 with the wafer 25. At this time, the wafer 25, like the mask 35, has the errors $\Delta \theta_Y$ and $\Delta Z$.

In a fourth process, therefore, the error $\Delta \theta_Y$ in the parallelism of the top surface of the wafer with respect to the top surface of the mask and the gap distance between the respective top surfaces of the mask and the wafer are measured.

More specifically, the mask stage controller 36 moves the X table 31 of the mask stage 30 on the reference plane 12 in the X-axis direction, whereupon the second sensors 52a and 52b measures distances $D_A$ and $D_B$ between themselves and two points A and B on the wafer, respectively. The measured values are supplied through the mask stage controller 36 to the second CPU 37 after being amplified by means of the amplifiers 38a and 38b. Since the distances $\epsilon_A$ and $\epsilon_B$ are known values, as mentioned before, the second CPU 37 can obtain distances $d_A$ and $d_B$ between the top surface of the mask and the two points A and B on the wafer, respectively, by subtracting the distances $\epsilon_A$ and $\epsilon_B$ from the distances $D_A$ and $D_B$, respectively. Based on these distances $d_A$ and $d_B$, the error $\Delta \theta_Y$ in the parallelism of the top surface of the wafer with respect to the top surface of the mask and the gap distance between the respective top surfaces of the mask and the wafer can be obtained.

In a fifth process, moreover, the gap distance between the respective top surfaces of the mask and the wafer can be set at the predetermined distance in parallel relation by adjusting the $\theta_Y$ table 22 and the Z table 23 on the wafer side in accordance with the error $\Delta \theta_Y$ in the parallelism and the gap distance obtained above.

In the fourth and fifth processes, the wafer may be positioned with respect to the second displacement sensors 52a and 52b instead of setting the gap distance between the respective top surfaces of the mask and the wafer at the predetermined distance in parallel relation. The top surface of the mask extends parallel to the reference plane 11, and the distances $\epsilon_A$ and $\epsilon_B$ lie between the top surface of the mask and the second displacement sensors 52a and 52b, respectively. If the set value of the gap distance between the mask and the wafer is d, therefore, the gap distance between the mask and the wafer can be set at d by executing correction in the Z-axis and $\theta_Y$ directions such that the distances between the top surface of the wafer and the second displacement sensors 52a and 52b are ($\epsilon_A$+d) and ($\epsilon_B$+d), respectively. Also in this case, the distances $d_A$ and $d_B$ are calculated in substance, and in the stage of the correction in the Z-axis and $\theta_Y$ directions, the error $\Delta \theta_Y$ in the parallelism of the top surface of the wafer, with respect to the top surface of the mask, and the gap distance between the respective top surfaces of the mask and the wafer are calculated.

According to the present embodiment, as described above, the distances are detected by means of the displacement sensors, so that it is unnecessary to use a complicated optical system, which is conventionally required, and the focus need not be accurately adjusted. Despite the use of a simple construction, therefore, the gap distance between the mask and the wafer can be very accurately set at the predetermined distance in parallel relation, even if the mounting accuracy of the mask and the wafer is poor, or if the mask and the wafer are subject to variations in thickness. In the present embodiment, moreover, the distance between the mask and the wafer is detected at the peripheral portion, so that the detection errors can be made smaller than in the case where the distance is detected at the central portion. By doing this, the possibility of the mask and the wafer running against each other can be eliminated.

Figure 5:
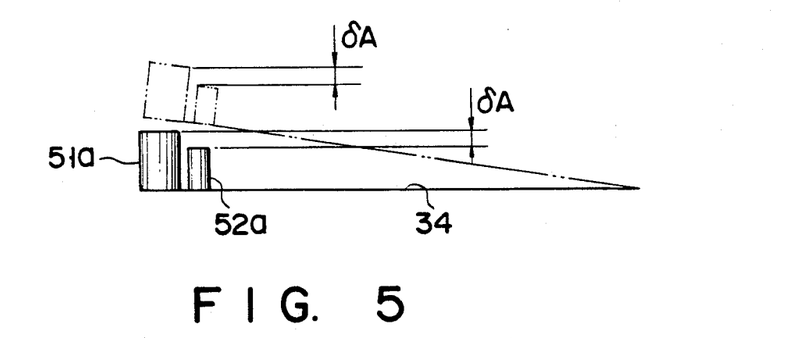
FIGS. 5 and 6 are views diagrammatically showing a target mounted on a mask chuck and a second displacement sensor.
Figure 6:
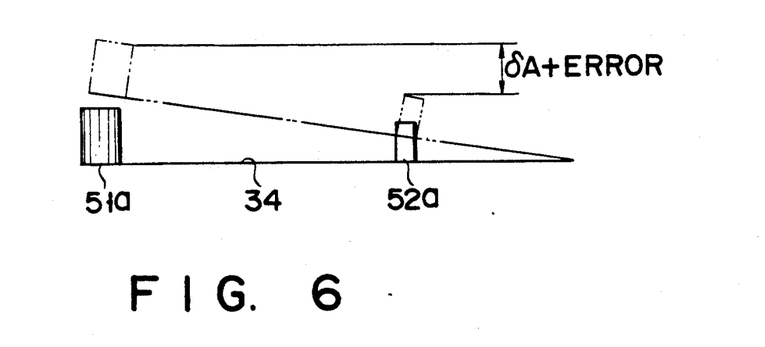

As shown in FIG. 5, the target 51a and the second displacement sensor 52a should be located as close to each other as possible. This is because if the target 51a and the sensor 52a are situated at a distance from each other, as shown in FIG. 6, an unnecessary error is caused between them, as indicated by the imaginary line in FIG. 6, when the mask chuck 34 rotates.

In the first embodiment described above, the gap distance is set in a two-dimensional space. The following is a description of a second embodiment in which the gap distance is set in a three-dimensional space.

Figure 7:
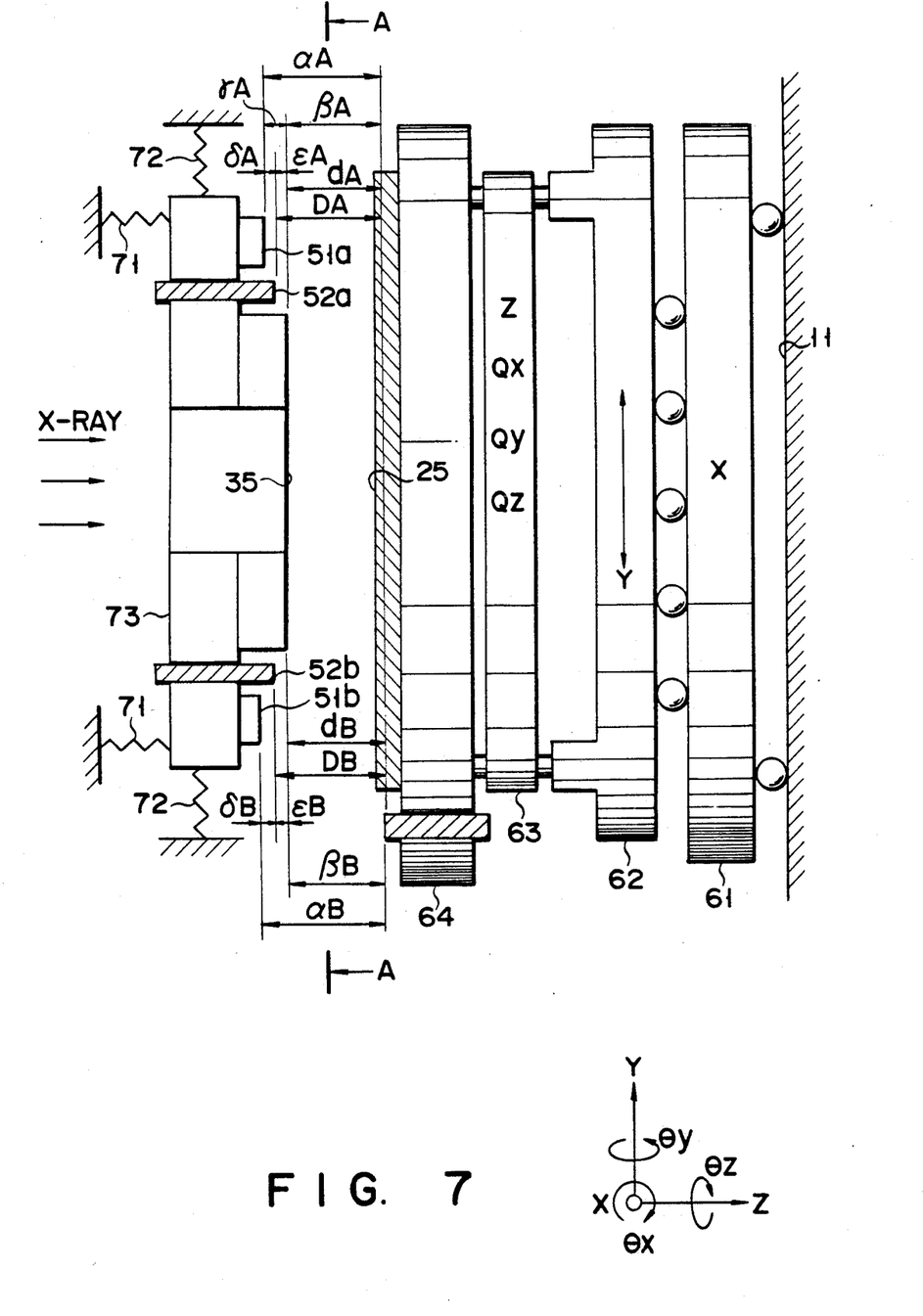
FIG. 7 is a view diagrammatically showing an apparatus for setting the gap distance between a mask and a wafer at a predetermined distance according to a second embodiment of the present invention.

In FIG. 7, a wafer stage 20 includes an X table 61 movable on a reference plane 11 in the X-axis direction, a Y table 62 mounted on the X table 61 so as to be movable in the Y-axis direction, and a shift mechanism 63 mounted on the Y table 62 so as to be movable or tiltable in the Z-axis, $\theta_X$, $\theta_Y$ and $\theta_Z$ directions. A wafer chuck 64 is provided on the shift mechanism 63. Likewise, a mask stage 30, which is illustrated only schematically, includes an X-Y table 71 and a shift mechanism 72 movable or tiltable in the Z-axis, $\theta X$, $\theta Y$ and $\theta Z$ directions. The table 71 and the mechanism 72 are connected to a mask chuck 73. As an X-ray exposure unit applies X-rays to a mask 35 and a wafer 25 at right angles thereto, a circuit pattern of the mask 35 is transferred to the resist of the wafer 25.

As in the case of the first embodiment, moreover, the wafer chuck 64 is provided with a first displacement sensor 41 which serves for setting the gap distance.

Figure 8:
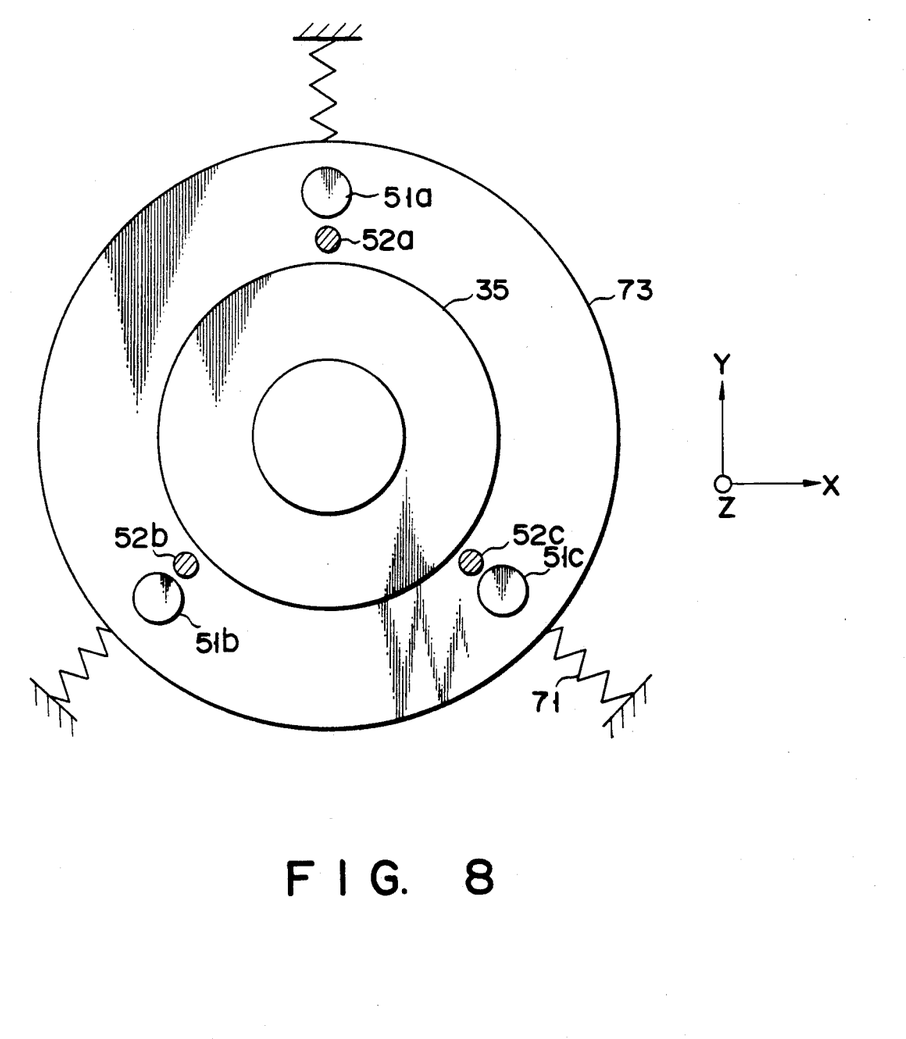
FIG. 8 is a fragmentary view taken in the direction of arrow A of FIG. 7.

In order to set distances in the three-dimensional space, on the other hand, the mask chuck 73 of the present embodiment is provided with three targets 51a, 51b and 51c and three second displacement sensors 52a, 52b and 52c, as is clearly shown in FIG. 8.

Since a control system of the second embodiment is arranged substantially in the same manner as that of the first embodiment, its illustration is omitted.

The following is a description of only the differences of the three-dimensional gap distance setting method according to the second embodiment from the first embodiment.

First, in a process to adjust the top surface of the mask parallel to the reference plane 11, the wafer chuck 64 is moved not only in the X-axis direction but also in the Y-direction, so that the first displacement sensor 41 scans the top surface of the mask in both the X- and Y-axis direction. Based on this scanning, the mask is tilted in the $\theta_X$ and $\theta_Y$ directions to keep the top surface of the mask parallel to the reference plane.

Then, in a process to measure distances $\epsilon_A$, $\epsilon_B$ and $\epsilon_C$ between the top surface of the mask and the second displacement sensors 52a, 52b and 52c, respectively, the first displacement sensor 41 scans the three targets 51a, 51b and 51c, thereby obtaining distances $\gamma_A$, $\gamma_B$ and $\gamma_C$.

Subsequently, in a process to adjust the top surface of the wafer parallel to the top surface of the mask, the second displacement sensors 52a, 52b and 52c measure distances $D_A$, $D_B$ and $D_C$ between themselves and three points on the top surface of the wafer, respectively.

Thus, by subtracting the distances $\epsilon_A$, $\epsilon_B$ and $\epsilon_C$ from the distances $D_A$, $D_B$ and $D_C$, respectively, distances $d_A$, $d_B$ and $d_C$ between the top surface of the mask and the three points o the top surface of the wafer can be obtained. Based on these values, errors $\Delta\theta_X$ and $\Delta\theta_Y$ in the parallelism of the top surface of the wafer, with respect to the top surface of the mask, and the gap distance between the respective top surfaces of the mask and the wafer can be calculated. By adjusting the wafer in the Z-axis, $\theta_X$ and $\theta_Y$ directions, the gap distance between the mask and the wafer can be set at a predetermined distance in parallel relation.

Figure 9:
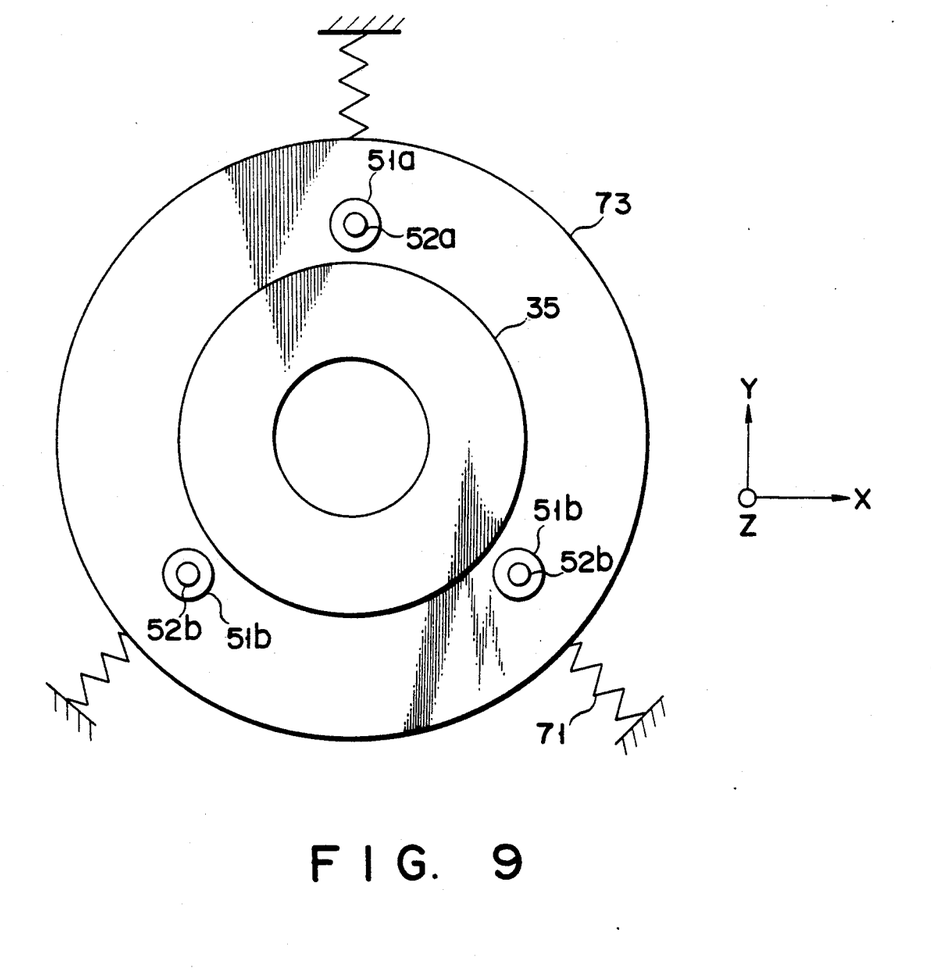
FIG. 9 is a view showing a modification of the second embodiment of the invention.

FIG. 9 shows a modification of the second embodiment. As in this modification, the three targets 51a, 51b and 51c may be formed integrally with their corresponding second displacement sensors 52a, 52b and 52c.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for setting the gap distance between first and second objects at a predetermined distance so that the respective sample surfaces of the first and second objects are parallel to each other, comprising steps of:
   (a) measuring an error in the parallelism of the sample surface of the second object with respect to an imaginary reference plane defined as a plane parallel to a direction in which the first object is transferred;
   (b) tilting the second object so as to eliminate the error in the parallelism, thereby keeping the sample surface of the second object parallel to the reference plane;
   (c) measuring an error in the parallelism of the sample surface of the first object with respect to the sample surface of the second object and the gap distance between the respective sample surfaces of the first and second objects; and
   (d) tilting the first object so as to eliminate the error in the parallelism, thereby keeping the respective sample surfaces of the first and second objects parallel to each other, and adjusting the gap distance between the respective sample surfaces of the first and second objects, thereby setting the gap distance between the sample surfaces at the predetermined distance.

2. A method for setting the gap distance between first and second objects at a predetermined distance so that the respective sample surfaces of the first and second objects are parallel to each other, by means of an apparatus which comprises a first moving stage mobable along an imaginary reference plane defined as a plane parallel to the transferring direction of the first object an supporting the first object, said first moving stage including means for tilting the first object and a first displacement sensor, and a second moving stage supporting the second object and including means for tilting the second object and at least two second displacement sensors, comprising steps of:
   (a) scanning the sample surface of the second object by means of the first displacement sensor in response to the movement of the first moving stage along the reference plane, thereby measuring an error in the parallelism of the sample surface of the second object with respect to the reference plane;

(b) tilting the second object so as to eliminate the error in the parallelism, thereby keeping the sample surface of the second object parallel to the reference plane;

(c) measuring distances between the second displacement sensors and at least two points on the sample surface of the first object by means of the second displacement sensors;

(d) subtracting the distances between the sample surface of the second object and the second displacement sensors from the measured distances, individually, thereby obtaining the gap distances between the sample surface of the second object and the at least two points on the sample suface of the first object, so that an error in the parallelism of the sample surface of the first object with respect to the sample surface of the second object and the gap distance between the respective sample surfaces of the first and second objects are calculated; and (e) tilting the first object so as to eliminate the calculated error in the parallelism, thereby keeping the respective sample surfaces of the first and second objects parallel to each other, and adjusting the gap distance between the respective sample surfaces of the first and seond objects so that the gap distance is set at the predetermined distance.

3. The method for setting the gap distance between two objects at a predetermined distance according to claim 2, wherein said second moving stage includes at least two targets arranged corresponding individually to the second displacement sensors, and said step (d) includes a substep of scanning the targets and the sample surface of the second object by means of the first displacement sensor in response to the movement of the first moving stage along the reference plane, thereby measuring distances ($\alpha_A$, $\alpha_B$) between the first displacement sensor and the targets and distances ($\beta_A$, $\beta_B$) between the sample surface of the second object and the first displacement sensor, a substep of calculating the differences between the distances ($\alpha_A$, $\alpha_B$) between the first displacement sensor and the targets and the distances ($\beta_A$, $\beta_B$) between the sample surface of the second object and the first displacement sensor, thereby obtaining distances ($\gamma_A$, $\gamma_B$) between the sample surface of the second object and the targets, and a substep of obtaining one of the sums of and the differences between the distances ($\gamma_A$, $\gamma_B$) between the sample surface of the second object and the targets and previously obtained distances ($\delta_A$, $\delta_B$) between the targets and the second displacement sensors, thereby obtaining distances ($\epsilon_A$, $\epsilon_B$) between the sample surface of the second object and the second displacement sensors.

4. An apparatus for setting the gap distance between first and second objects at a predetermined distance so that the respective sample surfaces of the first and second objects are parallel to each other, comprising:

a first moving stage movable along an imaginary reference plane defined as a plane parallel to a direction in which the first object is transferred and supporting the first object;

a second moving stage supporting the second object;

a first displacement sensor disposed on the first moving stage and adapted to scan the sample surface of the second object in response to the movement of the first moving stage along the imaginary reference plane, thereby measuring an error in the parallelism of the sample surface of the second object with respect to the reference plane;

tilting means attached to the second moving stage and adapted to tilt the second object so as to eliminate the error in the parallelism, thereby keeping the sample surface of the second object parallel to the reference plane;

at least two second displacement sensors disposed on the second moving stage and adapted to measure distances form at least two points on the sample surface of the first object;

arithmetic means for subtracting the distances between the sample surface of the second object and the second displacement sensors from the measured distances, individually, thereby obtaining the distances between the sample surface of the second object and the at least two points on the sample surface of the first object, so that an error in the parallelism of the sample surface of the first object with respect to the sample surface of the second object and the gap distance between the respective sample surfaces of the first and second objects are calculated;

tilting means attached to the first moving stage and adapted to tilt the first object so as to eliminate the error in the parallelism, thereby keeping the respective sample surfaces of the first and second object parallel to each other; and adjusting means for adjusting the gap distance between the respective sample surfaces of the first and second objects on the basis of the calculated gap distance so that the gap distance is set at the predetermined distance.

5. The apparatus for setting the gap distance between two objects according to claim 4, wherein said second moving stage includes at least two targets arranged corresponding individually to the second displacement sensors, said first displacement sensor scans the targets and the sample surface of the second object in response to the movement of the first moving stage along the reference plane, thereby measuring distances ($\alpha_A$, $\alpha_B$) between the first displacement sensor and the targets and distances ($\beta_A$, $\beta_B$) between the sample surface of the second object and the first displacement sensor, said arithmetic means calculates the differences between the distances ($\alpha_A$, $\alpha_B$) between the first displacement sensor and the targets and the distances ($\beta_A$, $\beta_B$) between the sample surface of the second object and the first displacement sensor, thereby obtaining distances ($\gamma_A$, $\gamma_B$) between the sample surface of the second object and the targets, and obtains one of the sums of and the differences between the distances ($\gamma_A$, $\gamma_B$) between the sample surface of the second object and the targets and previously obtained distances ($\gamma_A$, $\gamma_B$) between the targets and the second displacement sensors, thereby obtaining distances ($\epsilon_A$, $\epsilon_B$) between the sample surface of the second object and the second displacement sensors.

* * * * *